(12) United States Patent
Neuteboom et al.

(10) Patent No.: US 6,313,697 B1
(45) Date of Patent: Nov. 6, 2001

(54) DEVICE FOR AMPLIFYING SIGNALS

(75) Inventors: Harry Neuteboom; Eise C. Dijkmans, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/455,647

(22) Filed: Dec. 7, 1999

(30) Foreign Application Priority Data

Dec. 8, 1998 (EP) .................................................. 98204174

(51) Int. Cl.[7] .............................. H03F 3/38; H03F 21/00; H03F 3/217
(52) U.S. Cl. ......................... 330/10; 330/207 A; 330/251
(58) Field of Search .................................. 330/10, 207 A, 330/251

(56) References Cited

U.S. PATENT DOCUMENTS

| | | | |
|---|---|---|---|
| 3,931,581 | * 1/1976 | Kush, Jr. et al. ..................... | 330/10 |
| 5,075,634 | * 12/1991 | French ..................................... | 330/10 |
| 5,387,875 | 2/1995 | Tateno ..................................... | 330/10 |
| 5,442,317 | 8/1995 | Stengel ................................... | 330/10 |
| 5,506,493 | 4/1996 | Stengel ................................. | 323/223 |
| 5,617,058 | * 4/1997 | Adrian et al. ........................ | 330/251 |
| 6,097,249 | * 8/2000 | Strickland et al. ................... | 330/251 |

* cited by examiner

*Primary Examiner*—Robert Pascal
*Assistant Examiner*—Patricia T. Nguyen

(57) ABSTRACT

The device for amplifying input signals (10) comprises a control stage (12) and a switching bridge amplifier (14), which is coupled to said control stage via at least first and second control signals (16, 18). The bridge amplifier (14) can be switched in at least two states, in dependence upon the control signals (16, 18). The control stage (12) is embodied so as to control only a single substantially passive state of the bridge amplifier (14), as a result of which relatively small switching losses occur.

15 Claims, 3 Drawing Sheets

DEVICE FOR AMPLIFYING SIGNALS

The invention relates to a device for amplifying input signals, comprising a control stage and a switching bridge amplifier, which is coupled to said control stage via at least first and second control signals, the bridge amplifier being switchable in at least two states in dependence upon the control signals.

The invention also relates to an audio system and a hearing aid provided with such a device.

Such a device is disclosed in U.S. Pat. No. 5,387,875. In audio systems and hearing aids, such devices are often used to amplify audio signals. The device known from said United States patent document comprises an oscillator for generating a triangular reference signal, and first and second comparators for generating, respectively, a first and a second control signal. An input signal to be amplified is converted to the first control signal in the first comparator by comparing the input signal with the reference signal. Similarly, the input signal inverted by an inverter is converted to the second control signal in the second comparator by comparing the inverted input signal with the reference signal. Subsequently, the input signal is amplified by supplying the control signals to a switching bridge amplifier composed of four switches.

The switching bridge amplifier incorporated in the known device may be in four different states. These states are diagrammatically shown in FIGS. 2A through 2D. The FIGS. 2A and 2B show two active states of the bridge amplifier, wherein the bridge amplifier supplies power to a load 48. The FIGS. 2C and 2D show two passive states of the bridge amplifier, wherein the bridge amplifier does not supply power to the load 48. In the known device, all four states of the switching bridge amplifier are controlled by the control stage.

In the known device, relatively much power is dissipated in the bridge amplifier.

It is an object of the invention to provide a device of the type mentioned in the opening paragraph, in which relatively little power is dissipated in the bridge amplifier.

To achieve this, the device in accordance with the invention is characterized in that the control stage is embodied so as to control only a single substantially passive state of the bridge amplifier. In the known device, both passive states of the switching bridge amplifier, as shown in FIGS. 2C and 2D, are controlled by the control stage.

The invention is based on the recognition that the relatively high power dissipation in the known device is caused by the large number of switching operations performed by the switches in the bridge amplifier. The switching operation performed by a switch causes a small amount of power to be dissipated in the switch. These so-called switching losses are reduced in the device in accordance with the invention by controlling the bridge amplifier in such a manner that it can only be in one of the two passive states. The other passive state is not controlled. As a result, the switches in the bridge amplifier have to perform fewer switching operations, so that less power is dissipated.

An embodiment of the device in accordance with the invention is characterized in that the control stage comprises a conversion unit for converting the input signals into sign and magnitude-coded signals, said control stage also comprising a pulse width modulator for converting the magnitude of the coded signals to pulse width-modulated signals, and the control stage further comprising a generator for generating the control signals from the pulse width-modulated signals and the sign of the coded signals. It has been found that the control signals can be readily generated in this manner.

A further embodiment of the device in accordance with the invention is characterized in that the pulse width-modulated signals comprise at least bivalent signals, the generator being embodied so as to control the passive state of the bridge amplifier when the pulse width-modulated signals have a substantially low value. By virtue thereof, a simple implementation of the generator is achieved.

These and other aspects of the invention will be apparent from and elucidated with reference to the embodiments described hereinafter.

In the drawings.

In the Figures, like reference numerals refer to like parts.

Figure 1:
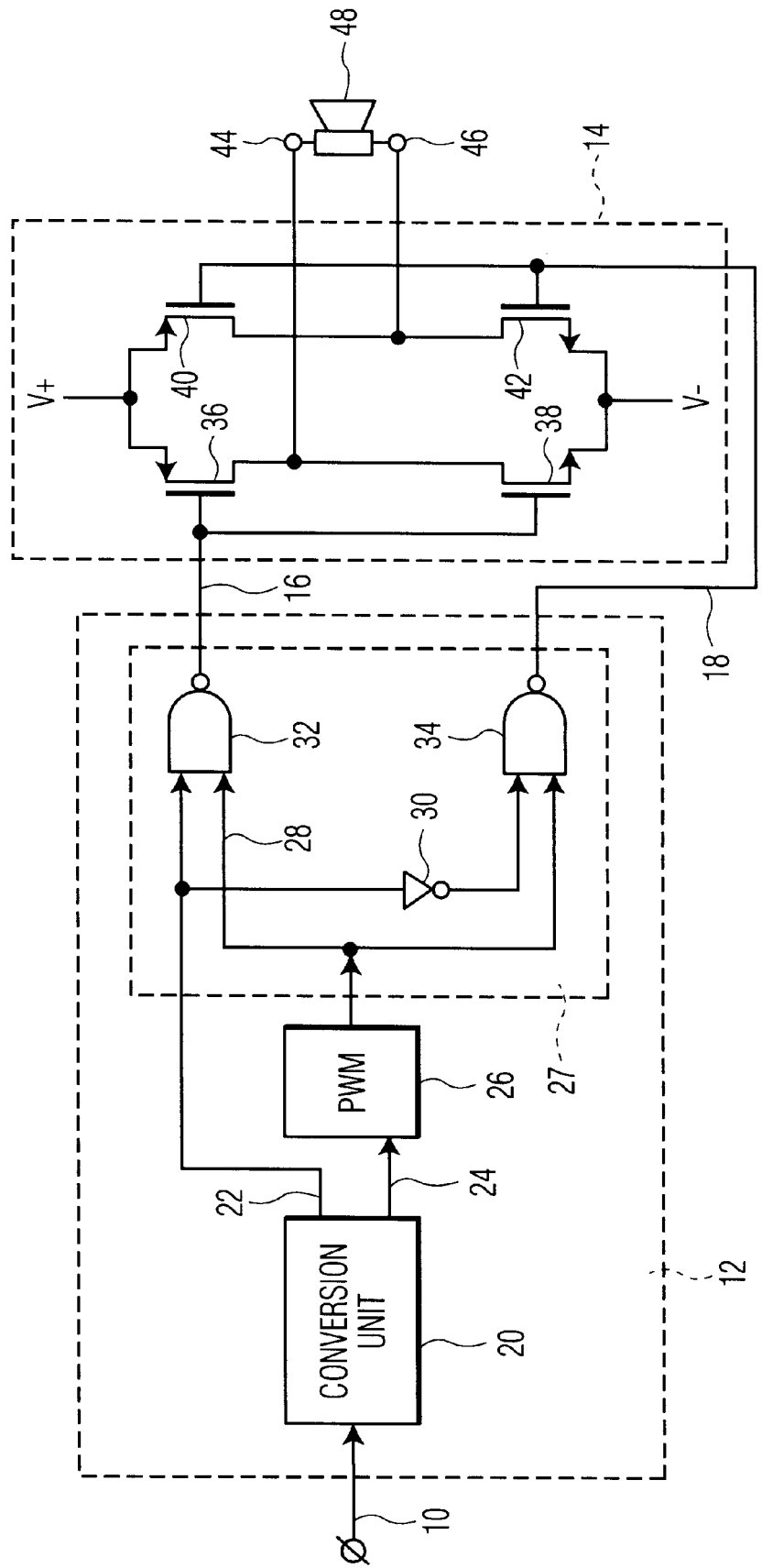
FIG. 1 shows a diagram of an example of a device in accordance with the invention.

FIG. 1 diagrammatically shows an example of a device in accordance with the invention. The device comprises a control stage 12 and a switching bridge amplifier 14, which is coupled to said control stage via a first control signal 16 and a second control signal 18. An input signal 10 to be amplified is converted by the control stage 12 to the first and the second control signals 16 and 18. By controlling the bridge amplifier 14 by these control signals 16 and 18, an input signal amplified by the device is obtained between two outputs 44 and 46. The input signal 10 may be, for example, an audio signal which, after it has been amplified, can be converted into sound by a loudspeaker 48 arranged between the outputs 44 and 46.

The control stage 12 comprises a conversion unit 20, a pulse width modulator 26 and a generator 27. In the conversion unit 20, the input signal 10 is converted to a sign and magnitude-coded signal, whereafter the sign 22 and the magnitude 24 of the coded signal are separated from each other. The magnitude 24 of the coded signal is subsequently converted to a pulse width-modulated signal 28 in the pulse width modulator 26. In the generator 27, the control signals 16 and 18 are generated from the pulse width-modulated signal 28 and the sign 22 of the coded signals.

The generator 27 comprises first and second NAND gates 32 and 34, and an inverter 30. By presenting the pulse width-modulated signal 28 and the sign 22 of the coded signals at the inputs of the first NAND gate 32, the first control signal 16 is formed at an output of the first NAND gate 32. The second control signal 18 is formed at an output of the second NAND gate 32 by presenting, at the inputs of the second NAND gate 34, the pulse width-modulated signal 28 and the sign 22 of the coded signals, which is inverted by the inverter 30.

The switching bridge amplifier 14 comprises four field effect transistors 36, 38, 40 and 42. Here, these transistors function as switching elements. The transistors 36 and 40 are so-called n-channel field effect transistors, and the transistors 38 and 42 are so-called p-channel field effect transistors. The sources of the transistors 36 and 40 are connected to a relatively high substantially fixed supply voltage V$^+$. The sources of the transistors 38 and 42 are connected to a relatively low substantially fixed supply voltage V$^-$. The drains of the transistors 36 and 38 are connected to each other and to the output 44. The drains of the transistors 40 and 42 are connected to each other and to the output 46. The gates of the transistors 36 and 38 are connected to the first control signal 16. The gates of the transistors 40 and 42 are connected to the second control signal 18.

If the first control signal 16 has a logic 1 value, then the transistor 36 is turned off, i.e., there is no conduction between the drain and the source of this transistor, while the transistor 38 is turned on, i.e., the drain and the source of this transistor are conductively interconnected. If the second control signal 18 has a logic 1 value, then the transistor 40 is turned off, i.e. there is no conduction between the drain and the source of this transistor, while the transistor 42 is turned on, i.e., the drain and the source of this transistor are conductively interconnected. At these values of the control signals 16 and 18, the bridge amplifier 14 is in the state shown in FIG. 2C. Analogous thereto, the bridge amplifier 14 is in the state shown in FIG. 2D if the control signals 16 and 18 both have a logic 0 value. The bridge amplifier 14 is in the state shown in FIG. 2A if the first control signal 16 has a logic 0 value, while the second control signal 18 has a logic 1 value. Finally, the bridge amplifier 14 is in the state shown in FIG. 2B if the first control signal 16 has a logic 1 value while the second control signal 18 had a logic 0 value.

Figure 2A:
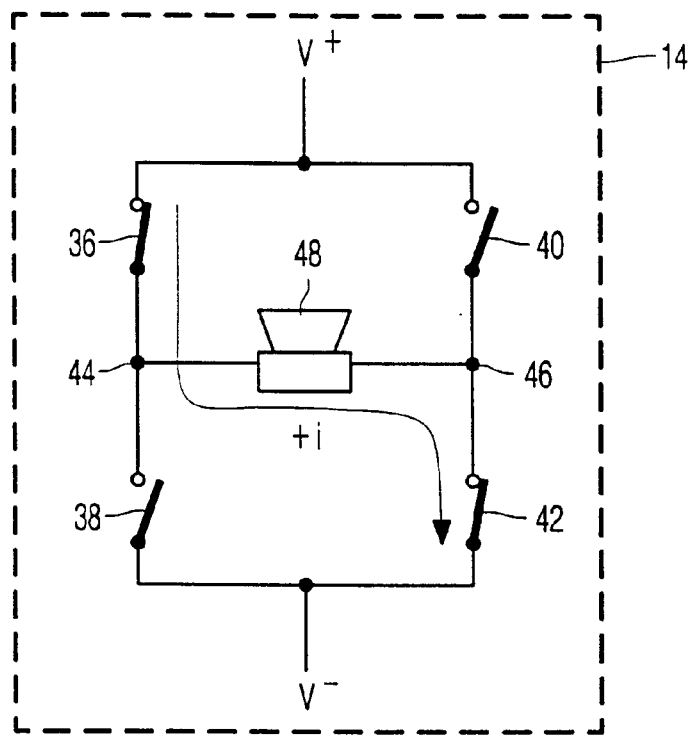
FIGS. 2A through 2D show a number of states of a switching bridge amplifier by means of which the operation of the device in accordance with the invention will be explained.
Figure 2B:
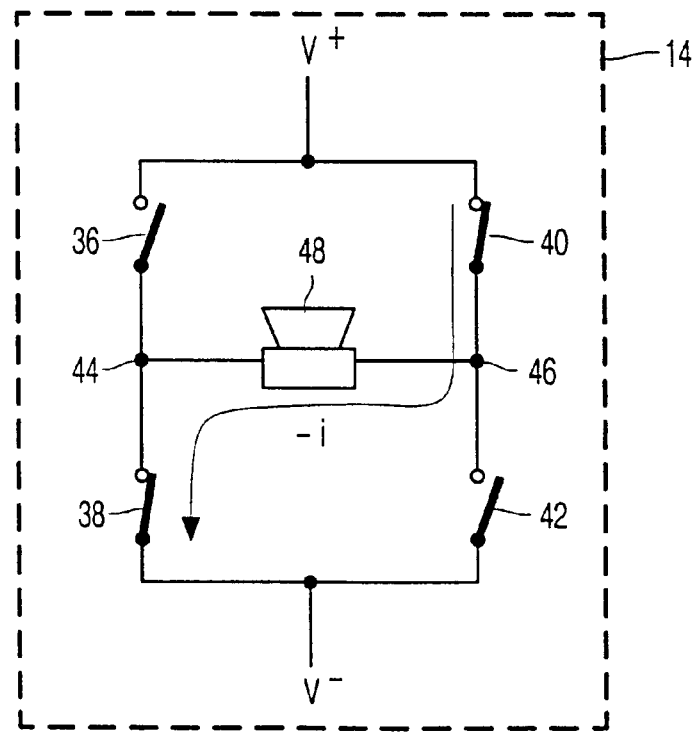
Figure 2C:
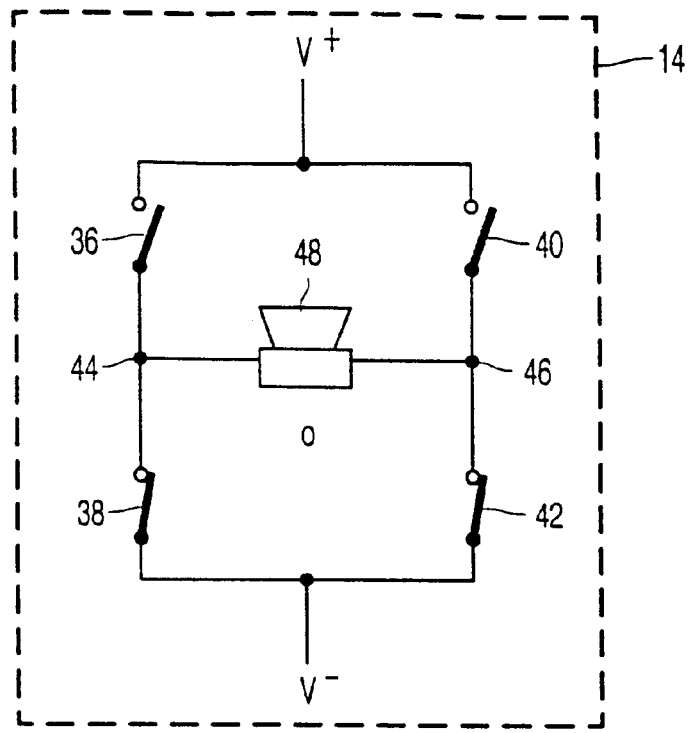

The construction of the control stage 12 shown in FIG. 1 causes the switching bridge amplifier 14 to be controlled by the control stage in such a manner that, in the case of a positive input signal 10, the bridge amplifier 14 is alternately in the states shown in FIGS. 2B and 2C, while in the case of a negative input signal 10, the bridge amplifier 14 is alternately in the states shown in FIGS. 2A and 2C. If the input signal 10 is zero, then the bridge amplifier 14 is in the passive state shown in FIG. 2C. At none of the values of the input signal 10, the bridge amplifier is in the passive state shown in FIG. 2D.

Figure 2D:
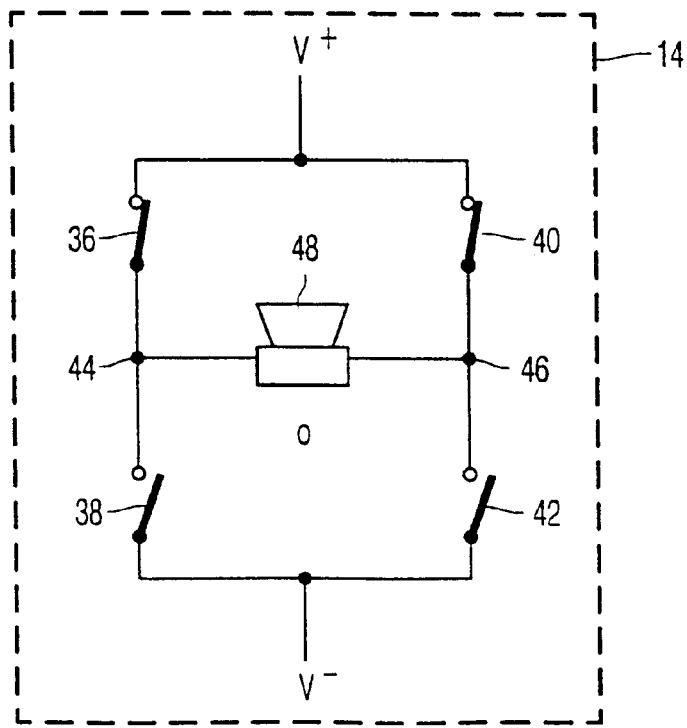

It will be obvious to those skilled in the art that the construction of the generator 27, as shown in FIG. 1, is only one of a large number of possible constructions. Firstly, the logic function obtained by means of AND gates can also be obtained by means of OR gates. In addition, it is possible to embody the generator 27 in such a way that the control signals 16 and 18 are exchanged. Finally, it is also possible to control the bridge amplifier 14 in such a manner that, instead of the passive state shown in FIG. 2C, the passive state shown in FIG. 2D is employed.

The device shown in FIG. 1 can particularly suitably be used in audio systems and hearing aids.

In FIGS. 2A through 2D, a number of states of the switching bridge amplifier 14 are shown. In FIG. 2A, a first active state of the bridge amplifier 14 is shown. Here, the switches 36 and 42 are turned on, and the switches 38 and 40 are turned off. As a result thereof, a current +i flows through a load 48 provided between the outputs 44 and 46. In FIG. 2B, a second active state of the bridge amplifier 14 is shown, wherein the switches 36 and 42 are turned off and the switches 38 and 40 are turned on. As a result, a current −i flows through the load 48. In FIG. 2C, a first passive state of the bridge amplifier 14 is shown. In this state, the switches 36 and 40 are turned off and the switches 38 and 42 are turned on. As a result, the outputs 44 and 46 are both connected to the relatively low supply voltage V⁻, so that no current flows through the load 48. Finally, in FIG. 2D, a second passive state of the bridge amplifier 14 is shown, wherein the switches 36 and 40 are turned on and the switches 38 and 42 are turned off. As a result, the outputs 44 and 46 are both connected to the relatively high supply voltage V⁺, so that, also in this state, no current flows through the load 48. In the device in accordance with the invention, the switching bridge amplifier 14 is controlled in such a manner that only one of the passive states shown in FIGS. 2C and 2D occurs.

What is claimed is:

1. A device for amplifying analog input signals, comprising
   a substantially fixed voltage source,
   a bridge amplifier supplied directly by said fixed voltage source, and
   a control stage receiving said input signals, and coupled to said bridge amplifier by first and second control signals for switching said bridge amplifier between at least two states,
   characterized in that said control stage switches said bridge amplifier between only a single substantially passive state and at least one active state.

2. A device as claimed in claim 1, characterized in that the control stage comprises:
   a conversion unit for converting the input signals into sign-coded signals and magnitude-coded signals,
   a pulse width modulator for converting the magnitude of the magnitude-coded signals into pulse width modulated signals, and
   a generator for generating the control signals from the pulse width modulated signals and the sign-coded signals.

3. A device as claimed in claim 2, characterized in that the pulse width modulated signals comprise at least bivalent signals, and the generator is arranged to control the bridge amplifier to be in said only a single substantially passive state when the pulse width modulated signals have a substantially low value.

4. A device as claimed in claim 2, characterized in that the generator consists of logic gates and an inverter.

5. A device as claimed in claim 4, characterized in that said logic gates are first and second NAND gates,
   the first NAND gate receiving the sign-coded signal at one input and the pulse width modulated signals at another input, and
   the second NAND gate receiving the sign-coded signal, inverted, at a first input and the pulse width modulated signals at a second input.

6. An audio system including a loudspeaker and a device for amplifying input signals, said device comprising
   a substantially fixed voltage source,
   a bridge amplifier supplied directly by said fixed voltage source and having an output connected to said loudspeaker, and
   a control stage receiving said input signals, and coupled to said bridge amplifier by first and second control signals for switching said bridge amplifier between at least two states,
   characterized in that said control stage switches said bridge amplifier between only a single substantially passive state and at least one active state.

7. An audio system as claimed in claim 6, characterized in that the control stage comprises:
   a conversion unit for converting the input signals into sign-coded signals and magnitude-coded signals,
   a pulse width modulator for converting the magnitude of the magnitude-coded signals into pulse width modulated signals, and
   a generator for generating the control signals from the pulse width modulated signals and the sign-coded signals.

8. An audio system as claimed in claim 7, characterized in that the pulse width modulated signals comprise at least bivalent signals, and the generator is arranged to control the bridge amplifier to be in said only a single substantially passive state when the pulse width modulated signals have a substantially low value.

9. An audio system as claimed in claim 7, characterized in that the generator consists of logic gates and an inverter.

10. An audio system as claimed in claim 9, characterized in that said logic gates are first and second NAND gates, the first NAND gate receiving the sign-coded signal at one input and the pulse width modulated signals at another input, and the second NAND gate receiving the sign-coded signal, inverted, at a first input and the pulse width modulated signals at a second input.

11. A hearing aid including a device for amplifying input signals, said device comprising a substantially fixed voltage source, a bridge amplifier supplied directly by said fixed voltage source, and a control stage receiving said input signals, and coupled to said bridge amplifier by first and second control signals for switching said bridge amplifier between at least two states, characterized in that said control stage switches said bridge amplifier between only a single substantially passive state and at least one active state.

12. A hearing aid as claimed in claim 11, characterized in that the control stage comprises:

a conversion unit for converting the input signals into sign-coded signals and magnitude-coded signals, a pulse width modulator for converting the magnitude of the magnitude-coded signals into pulse width modulated signals, and a generator for generating the control signals from the pulse width modulated signals and the sign-coded signals.

13. A hearing aid as claimed in claim 12, characterized in that the pulse width modulated signals comprise at least bivalent signals, and the generator is arranged to control the bridge amplifier to be in said only a single substantially passive state when the pulse width modulated signals have a substantially low value.

14. A hearing aid as claimed in claim 12, characterized in that the generator consists of logic gates and an inverter.

15. A hearing aid as claimed in claim 14, characterized in that said logic gates are first and second NAND gates, the first NAND gate receiving the sign-coded signal at one input and the pulse width modulated signals at another input, and the second NAND gate receiving the sign-coded signal, inverted, at a first input and the pulse width modulated signals at a second input.

* * * * *